July 21, 1970 R. VAN BLERKOM ET AL 3,521,042

SIMPLIFIED DIGITAL FILTER

Filed July 19, 1967 2 Sheets-Sheet 1

INVENTORS
R. VAN BLERKOM
D. G. FREEMAN
R. J. WARD

BY

T. Jauer Jr.
PATENT ATTORNEY 3,521,042
SIMPLIFIED DIGITAL FILTER

Richard Van Blerkom, Rockville, Don G. Freeman, Gaithersburg, and Richard J. Ward, Rockville, Md., assignors to International Business Machines Corporation, Armonk, N.Y., a corporation of New York Filed July 19, 1967, Ser. No. 654,568
Int. Cl. G06f 7/38; G01v 1/28
U.S. Cl. 235—156 4 Claims

ABSTRACT OF THE DISCLOSURE

A simplified digital filter wherein all possible products of the input are generated simultaneously. Appropriate products are gated to the various stages of the digital filter by selection circuitry. Filter parameters can be changed by controlling the selection circuitry.

This invention relates to simplified digital filters. More particularly, it relates to digital filters wherein the required number of adders is reduced.

For the purposes of the invention, the term "digital filter" includes any linear system that can be functionally described by a linear difference equation. One application of digital filters is in the process of spectrum shaping using digital components. The basic elements of digital filters are delay elements and adders. Most of the adders used in a given digital filter are incorporated within multiplier circuits in accordance with the desired coefficients of the filter. Since complex digital filters will heave many coefficients, a great number of adders may be required. This is especially true of filters that are designed in such a manner that the filter coefficients can be varied to perform different filtering functions.

One disadvantage of prior art digital filters is the slow speed of complex filters. It is therefore a primary object of this invention to increase the speed of specified digital filters. Another object of this invention is to reduce the number of adders needed in the implementation of complex digital filters.

In accordance with one aspect of this invention, a premultiply digital filter is provided comprising a product generator and selection circuitry. The input to the product generator is the filter input signal. The outputs of the product generator comprise all possible multiples of the input signal that may be needed for any desired set of coefficients for the digital filter. The outputs of the product generator are fed to one set of inputs of the selection circuitry. The selection circuitry also has a set of control inputs which control the gates within the selection circuitry. The outputs of the selection circuitry carry appropriate multiples of the input signal and are fed to the various stages of the digital filter.

The most significant advantage of this invention is that it increases the speed that can be achieved with digital filters. This leads to the further advantage that the bandwidth that can be processed in real time is increased.

Another significant advantage of the invention is that, for complex digital filters, the number of adders needed in the filter implementation will be substantially reduced. Although the reduction in the number of adders will necessitate an increase in the number of gates required in the correction circuity, this trade-off will be a favorable one in many applications involving complex digital filters.

Another advantage is that, since wider bandwidths can be processed in real time, in many applications the need for buffer storage will be eliminated.

The foregoing and other objects, features and advantages of the invention will be apparent from the following more particular description of preferred embodiments of the invention, as illustrated in the accompanying drawings.

For a general description of digital filters and some of their applications, reference is made to "Digital Filter Design Techniques in the Frequency Domain," C. M. Rader and B. Gold, Proceedings of the IEEE, February 1967, pp. 149–171 and the references cited therein.

Figure 1:
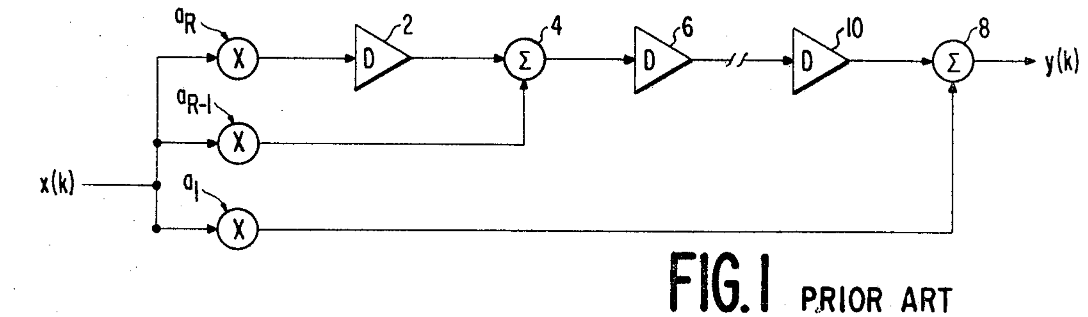
FIG. 1 PRIOR ART
FIG. 1 shows a pre-multiply transversal digital filter constructed using knowledge previously known in the art.

Referring to FIG. 1, there is shown an embodiment using prior art knowledge of a pre-multiply transversal digital filter. The input to the digital filter is an $n$-bit binary number representing the value of the input signal at the $k$th sample time and is designated $x(k)$. The input $x(k)$ is multiplied by factors $a_1, a_2 \ldots a_{R-1}', a_R$. The multiplication factors $a_1$ through $a_R$ will also be represented as binary numbers. The output of multiplier $a_R$ feeds a delay element 2 the output of which feeds one input of adder 4 the output of which feeds the input of delay element 6. The other input of adder 4 is connected to the output of multiplier $a_{R-1}$. The output of multiplier $a_1$ feeds one input of adder 8 the other input of which is connected to the output of delay element 10. The output of adder 8 is the output $y(k)$ of the digital filter. Each of the delay elements of the filter imposes a delay equal to the sample-period of the input $x(k)$. That is, if input signals were received at the rate of 1,000 samples per second, each delay element would impose a delay equal to one-thousandth of a second. Thus, the output $y(k)$ of the digital filter is equal to the sum of the last R signals received at the input each multiplied by some factor $a_i$. That is, $$y(k)=a_1x(k)+a_2x(k-1)+\ldots+a_{R-1}x(k-R+2)+a_Rx(k-R+1)$$

Each of the multipliers $a_1$ through $a_R$ will utilize a plurality of adders in order to accomplish the multiplication function. If each of the multiplication factors is $n$ bits in length and if maximum multiplication speed is desired, then each multiplier will require $n-1$ adders in order to have the capability of multiplying by any factor from 1 through $2^{n-1}$. Thus, $R(n-1)$ adders will be required to perform all of the possible multiplications. It will of course be recognized that if all possible multiplicands are not required, the number of adders needed could be reduced. However, in the most general case, $R(n-1)$ adders will be required. Thus, in the prior art embodiment of a pre-multiply digital filter, the number of adders needed to perform all possible multiplications is jointly dependent upon the number $n$ of binary digits in the multiplication factor and the number R of multiplication operations to be performed.

Figure 2:
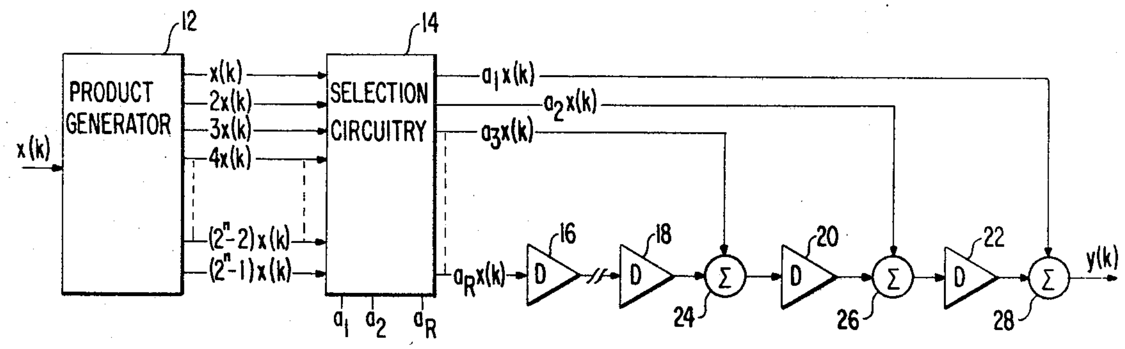
FIG. 2 shows a pre-multiply transversal digital filter embodying this invention.

Referring now to FIG. 2, a pre-multiply transversal digital filter embodying this invention is shown. The invention comprises a product generator 12, selection circuitry 14, delay elements 16, 18, 20 and 22 and adders 24, 26 and 28. The product generator 12 receives its input from the filter input signals $x(k)$. The product generator has $2^n-1$ outputs where $n$ is equal to the number of binary digits that may appear in a coefficient. The signals appearing on the $2^n-1$ output lines of the product generator 12 represent all possible necessary multiples of the input signal $x(k)$. The selection circuitry has two sets of inputs. The first set of inputs comprises $2^n-1$ lines each of which receives a signal from one of the output lines of the product generator 12 so that all possible multiples of the input signal $x(k)$ are fed to the selection circuitry. The selection circuitry also has another set of R inputs $a_1$ through $a_R$ where R is equal to the number of coefficients of the digital filter. The inputs $a_1$ through $a_R$ control gates or switches within the selection circuitry 14 which determine the multiples of $x(k)$ which appear on the output lines of the selection circuitry. The R outputs of the selection circuitry are connected to the remaining delay elements and adders of the digital filter in the same manner as are the outputs of the multipliers described in FIG. 1.

In order for the product generator 12 to be capable of generating all possible multiples of the input signal $x(k)$ $2^{n-1}-1$ adders are required. It is significant to note that the number of adders required does not depend at all upon R, the number of coefficients of the digital filter. The complexity of the selection circuitry 14 will depend upon both R and $n$, but since gates and switches are simpler than adders, the use of this invention in implementing complex digital filters (where R is a large number) will often effect a net saving in the total amount of hardware needed to implement a digital filter.

Figure 3:
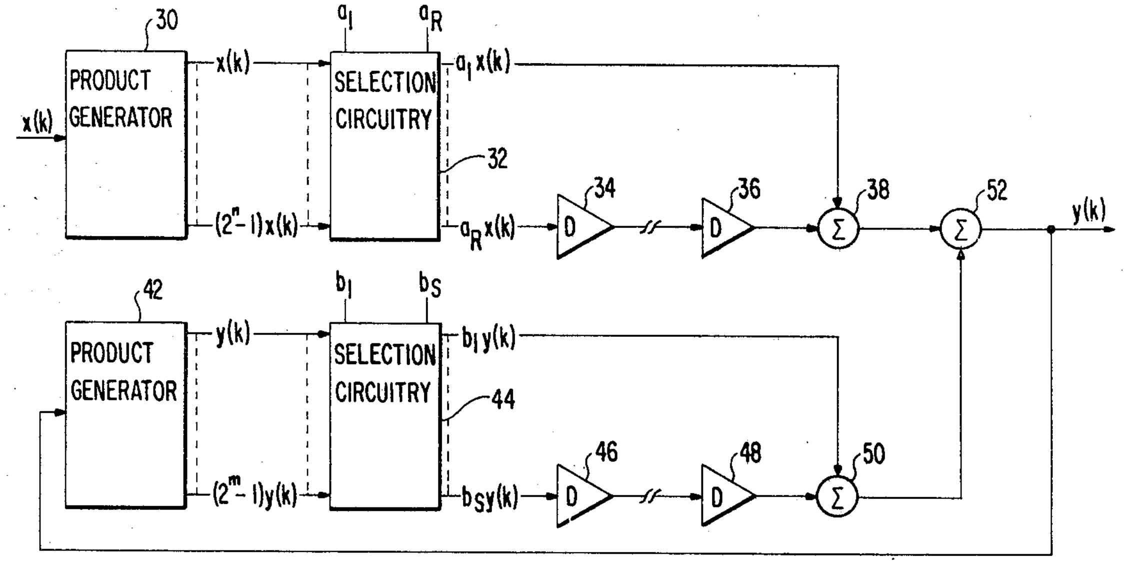
FIG. 3 shows a recursive (feedback) digital filter embodying this invention.

Referring to FIG. 3, a recursive digital filter embodying this invention is shown. The upper half of the digital filter shown in FIG. 3 is identical to the digital filter shown in FIG. 2. It comprises a product generator 30, selection circuitry 32, delay elements 34 . . . 36 and adders . . . 38. To the above has been added a second product generator 42 with its associated selection circuitry 44, additional delay elements 46 . . . 48 and additional adders . . . 50. The outputs of adders 38 and 50 (appearing in the upper part and the lower part of FIG. 3, respectively) are connected to the inputs of adder 52 the output of which serves as the output $y(k)$ of the digital filter.

Product generator 42 receives its input from the output of adder 52 providing feedback into the digital filter from the output $y(k)$ of the digital filter. Product generator 42 has $2^m-1$ outputs upon which appear all possible multiples of $y(k)$, where $m$ is equal to the number of binary digits which may comprise any coefficient which may be used in the feedback portion of the digital filter. The outputs of product generator 42 feeds $2^m-1$ corresponding inputs to the selection circuitry 44. Selection circuitry 44 has another group of S inputs $b_1$ through $b_S$ controlling switches or gates within the selection circuitry 44 which determine the multiples of $y(k)$ which appear on the S output lines of selection circuitry 44. S is equal to the number of coefficients used in the feedback portion of the digital filter. Note that $m$ may be but need not be equal to $n$ and that F may be but need not be equal to R. Thus, the output of the digital filter shown in FIG. 3 will be $$y(k)=a_1x(k)+ \dots +a_Rx(k-R+1) +b_1y(k)+ \dots +b_Sy(k-S+1)$$

where $x(k-i)$ is equal to the input to the digital filter "$i$" sample periods before the present output and $y(k-j)$ is equal to the output of the digital filter "$j$" sample periods before the present output.

Figure 4:
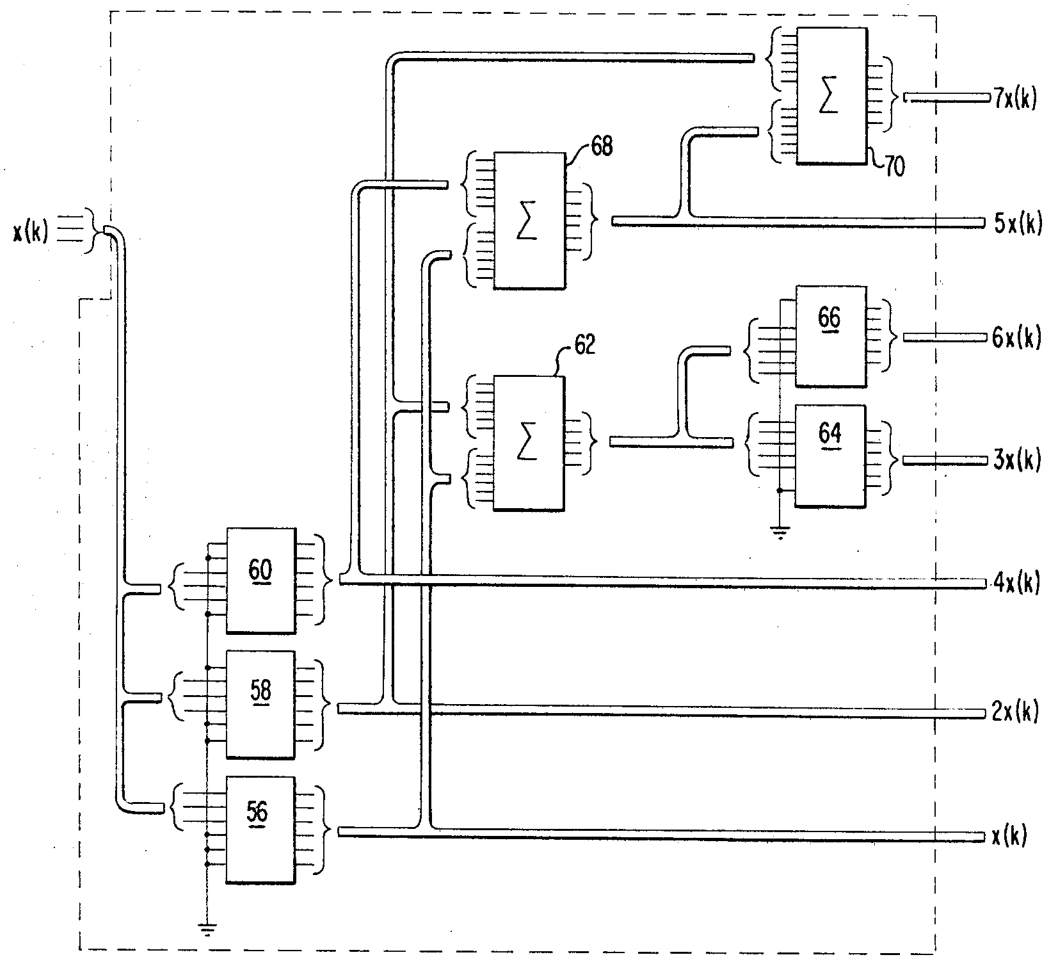
FIG. 4 shows one manner of implement the product generator for a filter whose coefficients are three bits in length.

Referring to FIG. 4, one embodiment of a product generator is shown. In the embodiment of FIG. 4, it is presumed that all of the coefficients will have three or fewer binary digits; that is, no coefficient will have a value greater than seven. The circuitry shown in FIG. 4 takes advantage of the well-known fact that a binary number in a register is multiplied by two by shifting the entire number one position in the direction of its most significant (highest order) digit or merely by redefining the lines which come out of the register. The input signal $x(k)$, which consists of a three-digit binary number, is fed to registers 56, 58 and 60. In accordance with a technique well-known in the art, the input and output lines of the registers are defined in such a manner that the output of register 56 is equal to $x(k)$, the output of register 58 is equal to $2x(k)$ and the output of register 60 is equal to $4x(k)$. Redefinition of the output lines of a register is known in the art to be equivalent to shifting the contents of a register. The output of register 56 is connected to the $x(k)$ output of the product generator; the output of register 58 is connected to the $2x(k)$ output of the product generator; and the output of register 60 is connected to the $4x(k)$ output of the product generator. In order to generate the product $3x(k)$, the outputs of registers 56 and 58 are connected to the inputs of adder 62 the output of which is connected, through register 64, to the $3x(k)$ output of the product generator. In order to obtain the product $6x(k)$, the output of adder 62 is also connected to register 66 the output of which is connected to the $6x(k)$ output of the product generator. Register 66 serves the purpose of redefining the output of added 62 to produce the product $(2)(3x(k))=6x(k)$. In order to obtain the product $5x(k)$, the output of registers 58 and 60 are connected to the inputs of adder 68 the output of which is connected to the $5x(k)$ output of the product generator. In order to obtain the product $7x(k)$, the output of adder 68 and the output of register 58 are connected to the input of adder 70 the output of which is connected to the $7x(k)$ output of the product generator.

It will be recognized that, even for this simple example, many variations could be made within the product generator. For example, the product $7x(k)$ was formed above by adding $5x(k)$ to $2x(k)$; but it could just as easily have been formed by adding $4x(k)$ to $3x(k)$. Also, the product $5x(k)$ which was formed above by adding $4x(k)$ to $x(k)$ could just as easily have been formed by adding $3x(k)$ to $2x(k)$. If serial arithmetic were to be used, then the product generator could have been implemented using delay elements instead of using the redefinition of lines described above. The significant fact to be realized is that the product generator can be implemented using a maximum of $2^{n-1}-1$ adders where $n$ is the maximum number of binary digits that may be contained in any multiplication factor. For this example, $n=3$ so the number of adders required is $2^{3-1}-1=3$.

Figure 5:
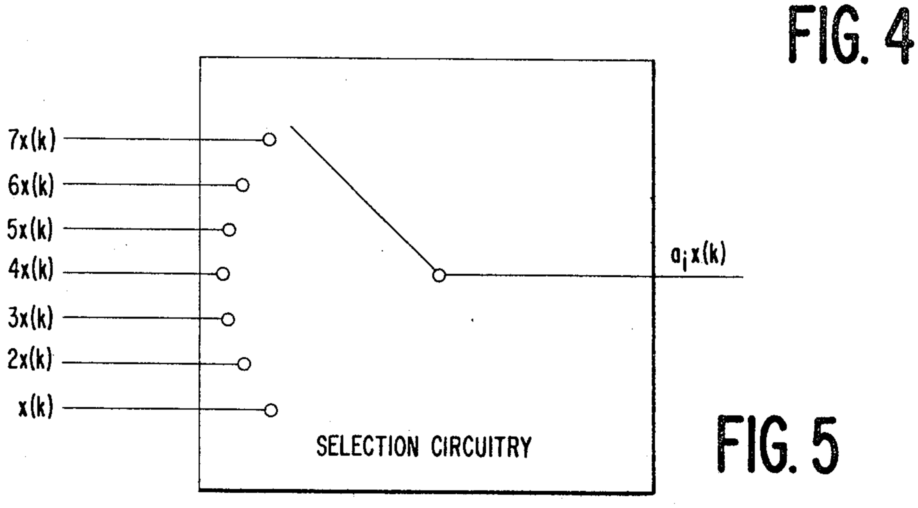
FIG. 5 shows one implementation of selection circuitry that may be used with the product generator of FIG. 4.

Referring to FIG. 5, there is shown a simple seven-position switch that could be used in selection circuitry that is associated with the product generator shown in FIG. 4. The switch has seven inputs corresponding to the sevent outputs of the product generator and carrying all possible multiples of the input signal $x(k)$. The implementation of such switches using electronic devices is well known in the art and need not be described here. Each of the seven inputs to the switch carries a six-digit binary representation of a multiple of the input signal $x(k)$. Coefficients of the digital filter are selected and/or changed merely by setting the switch. The selection circuitry will contain one such switch for each coefficient of the digital filter.

Those skilled in the art will recognize that various modifications can be made to this invention. For example, in the case of the recursive filter shown in FIG. 3, it would be possible for a single premultiplier to be used. However, this would require time-sharing and would introduce various timing problems. For this reason, it will often be preferbale to use two separate product generators.

Also, it will be recognized that this invention is not limited to time-variant digital filters. That is, it can also be advantageausly used in digital filters where the coefficients never change. If, for example, one wished to build a digital filter which had the coefficients 2, 3, 4 and 6, this invention could advantageously be used. In such a case, this invention would require only one adder in the product generator (to generate the product $3x(k)$). The $5x(k)$ and $7x(k)$ outputs of the product generator shown in FIG. 4 would not be needed and the adders 68 and 70 that are used in generating those products could be eliminated. This still represents an improvement over the prior art because the prior art digital filter implemented for the coefficients 1, 2, 3, 4 and 6 would require an adder to generate the product $3x(k)$ and another adder to generate the product $6x(k)$.

Still another variation of this invention would be to replace the plurality of adders in a filter (e.g., adders 24, 26 and 28 shown in FIG. 2) by a single adder that is time-shared. Such a single time-shared adder is of course a well-known equivalent of the plurality of adders that has been shown and described above.

While the invention has been particularly shown and described with reference to preferred embodiments thereof, it will be understood by those skilled in the art that various changes in form and details may be made therein without departing from the spirit and scope of the invention.

What is claimed is:

1. A digital filter, comprising:

multiplication means having a multiplication input and $j+1$ multiplication outputs, where $j$ is a positive integer, each of said multiplication outputs carrying a signal that is a predetermined multiple of a signal appearing at said multiplication input;

$j$ signal delay means, each having a delay input and a delay output, a first one of said signal delay means having its delay input connected to one of said multiplication outputs;

each of said $j$ delay means having associated therewith, an associated adding means, each of said associated adding means having a first input, a second input, and a sum output, said delay output of each of said signal delay means being connected to said first input of its said associated adding means, said second input of each of said associated adding means being connected to a different one of $j$ remaining unconnected multiplication outputs of said multiplication means, each of $j-1$ of said sum outputs being connected to a different one of $j-1$ remaining unconnected delay inputs of said signal delay means such that each signal delay means with its associated adding means is connected in series with all other signal delay means and their associated adding means, a $j$th associated adding means, being the last associated adding means of said series, providing at its sum output, a signal which is a filtered response to said signal appearing at said input of said multiplication means;

wherein said multiplication means comprises:

product generating means having a generator input and a plurality of generator outputs, said product generating means generating on each of said generator outputs a signal that is a predetermined multiple of a signal appearing at said generator input, said generator outputs carrying all possible necessary multiples of the signal appearing at said generator input; and selection means connecting the first input of each of said $n$ adders to one of said generator outputs.

2. The digital filter of claim 1 wherein said selection means comprises:

variable means for selectively connecting each of said generator outputs to said first input of each of said adders.

3. The digital filter of claim 2 wherein said product generating means comprises:

exactly $2^{n-1}-1$ summing means where $n$ is equal to the largest number of digits contained in any factor by which the signal appearing at said generator input will be multiplied.

4. The digital filter of claim 1 wherein said product generating means consists of:

exactly $2^{n-1}-1$ summing means where $n$ is equal to the largest number of digits contained in any factor by which the signal appearing at said generator input will be multiplied.

References Cited

UNITED STATES PATENTS

| | | | |
|---|---|---|---|
| 3,281,776 | 10/1966 | Ruehle | 340—15.5 |
| 3,303,335 | 2/1967 | Pryor | 235—152 X |
| 3,314,015 | 4/1967 | Simone | 328—165 |
| 3,371,342 | 2/1968 | Carre | 343—17.1 |

EUGENE G. BOTZ, Primary Examiner

C. E. ATKINSON, Assistant Examiner

U.S. Cl. X.R.

235—164; 328—165; 340—15.5; 343—17.1